(12) United States Patent
Sachet et al.

(10) Patent No.: US 10,158,040 B2
(45) Date of Patent: Dec. 18, 2018

(54) POLARITONIC HOT ELECTRON INFRARED PHOTODETECTOR

(71) Applicant: North Carolina State University, Raleigh, NC (US)

(72) Inventors: Edward Sachet, Raleigh, NC (US); Jon-Paul Maria, Raleigh, NC (US); Christopher Shelton, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 15/644,216

(22) Filed: Jul. 7, 2017

(65) Prior Publication Data

US 2018/0013031 A1    Jan. 11, 2018

Related U.S. Application Data

(60) Provisional application No. 62/360,073, filed on Jul. 8, 2016.

(51) Int. Cl.
*H01L 31/112* (2006.01)
*G01J 1/44* (2006.01)
(Continued)

(52) U.S. Cl.
CPC ............ *H01L 31/112* (2013.01); *G01J 1/044* (2013.01); *G01J 1/42* (2013.01); *G01J 1/44* (2013.01);
(Continued)

(58) Field of Classification Search
CPC ......... H01L 27/14643; H01L 27/14609; H01L 27/14603; H01L 27/1463; H01L 27/14632
See application file for complete search history.

(56) References Cited

U.S. PATENT DOCUMENTS 6,262,418 B1 *  7/2001  Hashimoto ............... G01J 5/34
                                                    250/338.3
6,563,185 B2 *  5/2003  Moddel ................... B82Y 10/00
                                                    257/425
(Continued)

OTHER PUBLICATIONS

Aspnes, Plasmonics and effective-medium theories. Thin Solid Films 519, 2571-2574 (2011).
(Continued)

*Primary Examiner* — Quoc Hoang
(74) *Attorney, Agent, or Firm* — Michael Best & Friedrich LLP

(57) ABSTRACT

Polaritonic hot electron infrared photodetector that detect infrared radiation. In one implementation, the polaritonic hot electron infrared photodetector includes a first contact layer, a second contact layer, a first dielectric layer, a second dielectric layer, and a conductor layer. The first dielectric layer is coupled between the first contact layer and the second contact layer. The second dielectric layer is coupled between the first dielectric layer and the second contact layer. The conductor layer is coupled between the first dielectric layer and the second dielectric layer. Infrared radiation incident upon the conductor layer is operable to create hot carriers that are injected from a conduction band of the conductor layer to a conduction band of the second contact layer.

18 Claims, 12 Drawing Sheets

(51) Int. Cl.
*G01J 1/04* (2006.01)
*H01L 31/0296* (2006.01)
*G02B 5/00* (2006.01)
*G01J 1/42* (2006.01)
*G01J 5/10* (2006.01)

(52) U.S. Cl.
CPC ............... *G01J 5/10* (2013.01); *G02B 5/008* (2013.01); *H01L 31/02963* (2013.01)

(56) References Cited

U.S. PATENT DOCUMENTS

| | | |
|---|---|---|
| 2010/0127255 A1 | 5/2010 | Allen et al. |
| 2012/0139074 A1 | 6/2012 | Abe |
| 2014/0060643 A1 | 3/2014 | Martin et al. |
| 2016/0211475 A1 | 7/2016 | Chaki Roy et al. |
| 2017/0084399 A1 | 3/2017 | Vak |

OTHER PUBLICATIONS

Atwater, H.A. & Polman, A., "Plasmonics for improved photovoltaic devices," Nat. Mater., 9, 205-213 (2010).
"Boltasseva, A., ""Empowering plasmonics and metamaterials technology with new material platforms,"" MRS Bull. (2014) doi:10.1557/mrs.2014.91."
Born et al., Principles of Optics: Electromagnetic Theory of Propagation, Interference and Diffraction of Light. (CUP Archive, 2000).
Brongersma et al., Plasmon-induced hot carrier science and technology. Nat. Nanotechnol. 10, 25-34 (2015).
Burbano et al., "Sources of Conductivity and Doping Limits in CdO from Hybrid Density Functional Theory," J. Am. Chem. Soc., 133, 15065-15072 (2011).
Campione et al. Epsilon-Near-Zero Modes for Tailored Light-Matter Interaction. Phys. Rev. Appl. 4, 44011 (2015).
Campione et al., Theory of epsilon-near-zero modes in ultrathin films. Phys. Rev. B 91, 121408 (2015).
Cerruti et al., "Influence of indium-tin oxide surf ace structure on the ordering and coverage of carboxylic acid and thiol monolayers," J. Phys. Appl. Phys., 40, 4212-4221 (2007).
Global Infrared Sensors Market Analysis and Forecast (2014-2019).
Izzia et al., "Room temperature Vs. LN2-Cooled Detectors Infrared Microscopy Cost/Performance Analysis," Thermo Scientific, Technical Note 51513 (2008).
Knight et al. Embedding Plasmonic Nanostructure Diodes Enhances Hot Electron Emission. Nano Lett. 13, 1687-1692 (2013).
Knight et al., "Photodetection with Active Optical Antennas," Science, 332, 702-04 (2011).
Losego et al., "Conductive oxide thin films: Model systems for understanding and controlling surface plasmon resonance," J. Appl. Phys., 106, 024903 (2009).
Manjavacas et al., "Plasmon-Induced Hot Carriers in Metallic Nanoparticles," ACS Nano, 8, 7630-7638 (2014).
Markets and Markets Report, Infrared Detector Market by Type (MCT, INGAAS, Pyroelectric, Thermopile Microbolometer and Others), Technology (Cooled Infrared, and Uncooled Infrared), Wavelength (Short, Medium, and Long Infrared), Application, and Geography—Global Forecast to 2020, (2016) Report Code SE 2275.
Rhodes et al., Investigation of hexadecanethiol self-assembled monolayers on cadmium tin oxide thin films. Thin Solid Films 516, 1838-1842 (2008).
"Sachet et al., ""Dysprosium-doped cadmium oxide as a gateway material for mid-infrared plasmonics,"" Nat. Mater. Advance online publication (2015)."
Sachet et al., "Mid-infrared surface plasmon resonance in zinc oxide semiconductor thin films," J. P. Appl. Phys. Lett., 102, 051111-051111-4 (2013).
Sarid et al., Modem Introduction to Surface Plasmons: Theory, Mathematica Modeling, and Applications. (Cambridge University Press, 2010).
Sobhani et al., "Narrowband photodetection in the near-infrared with a plasmon-induced hot electron device," Nat. Commun., 4, 1643 (2013).
Sundararaman et al., Theoretical predictions for hot-carrier generation from surface plasmon decay. Nat. Commun. 5, (2014).
United States Patent Office Action for U.S. Appl. No. 15/142,494 dated Apr. 6, 2017 (8 pages).
United States Patent Office Action for U.S. Appl. No. 15/142,494 dated Dec. 18, 2017 (7 pages).
United States Patent Office Notice of Allowance for U.S. Appl. No. 15/142,494 dated May 18, 2018 (10 pages).
United States Patent Office Action for U.S. Appl. No. 15/142,494 dated Nov. 2, 2018 (6 pages).

* cited by examiner

POLARITONIC HOT ELECTRON INFRARED PHOTODETECTOR

RELATED APPLICATIONS

This patent application claims priority from U.S. Provisional Application No. 62/360,073 filed Jul. 8, 2016, entitled, "POLARITONIC HOT ELECTRON INFRARED PHOTODETECTOR," the disclosure of which is incorporated herein, in its entirety, by reference.

BACKGROUND

This disclosure relates to detecting infrared radiation.

The contents of the references listed below are incorporated herein, in their entirety, by reference:
1. Born, M. & Wolf, E. Principles of Optics: Electromagnetic Theory of Propagation, Interference and Diffraction of Light. (CUP Archive, 2000).
2. Sarid, D. & Challener, W. Modern Introduction to Surface Plasmons: Theory, Mathematica Modeling, and Applications. (Cambridge University Press, 2010).
3. Aspnes, D. E. Plasmonics and effective-medium theories. Thin Solid Films 519, 2571-2574 (2011).
4. Rhodes, C. L., Brewer, S. H., Folmer, J. & Franzen, S. Investigation of hexadecanethiol self-assembled monolayers on cadmium tin oxide thin films. Thin Solid Films 516, 1838-1842 (2008).
5. Campione, S. et al. Epsilon-Near-Zero Modes for Tailored Light-Matter Interaction. Phys. Rev. Appl. 4, 44011 (2015).
6. Campione, S., Brener, I. & Marquier, F. Theory of epsilon-near-zero modes in ultrathin films. Phys. Rev. B 91, 121408 (2015).
7. Knight, M. W. et al. Embedding Plasmonic Nanostructure Diodes Enhances Hot Electron Emission. Nano Lett. 13, 1687-1692 (2013).
8. Brongersma, M. L., Halas, N. J. & Nordlander, P. Plasmon-induced hot carrier science and technology. Nat. Nanotechnol. 10, 25-34 (2015).
9. Sundararaman, R., Narang, P., Jermyn, A. S., Goddard Iii, W. A. & Atwater, H. A. Theoretical predictions for hot-carrier generation from surface plasmon decay. Nat. Commun. 5, (2014).
10. Manjavacas, A., Liu, J. G., Kulkarni, V. & Nordlander, P. Plasmon-induced hot carriers in metallic nanoparticles. ACS Nano 8, 7630-7638 (2014).

SUMMARY

This disclosure provides a polaritonic hot electron infrared photodetector ("PHIP") that detects radiation (for example, infrared radiation). The PHIP operates in an optical mode called the epsilon near zero ("ENZ") mode. In the ENZ mode, a dielectric constant of conductor material in the PHIP becomes zero. The ENZ resonance energy is tunable based on the conductor's free carrier concentration (for example, by the choice of the conductor material, doping, and alloying). The decay of the ENZ mode creates hot electrons which are distinguished from the bulk of conduction electrons by higher kinetic energy. The PHIP allows the hot electrons to be extracted and measured as a photocurrent. In some implementations, the PHIP includes a single PHIP element. In some implementations, the PHIP includes multiple PHIP elements that are combined into a more complex PHIP. In such implementations, the absorption of each individual PHIP element adds up and the combined absorption of the PHIP is tunable.

This disclosure also provides a detector for detecting infrared radiation. In one implementation, the detector includes a first contact layer, a second contact layer, a first dielectric layer, a second dielectric layer, and a conductor layer. The first dielectric layer is coupled between the first contact layer and the second contact layer. The second dielectric layer is coupled between the first dielectric layer and the second contact layer. The conductor layer is coupled between the first dielectric layer and the second dielectric layer. Infrared radiation incident upon the conductor layer is operable to create hot carriers that are injected from a conduction band of the conductor layer to a conduction band of the second contact layer.

This disclosure further provides a detector for detecting infrared radiation. In one implementation, the detector includes a first contact layer, a second contact layer, a first dielectric layer, a second dielectric layer, a third dielectric layer, a first conductor layer, and a second conductor layer. The first dielectric layer is coupled between the first contact layer and the second contact layer. The second dielectric layer is coupled between the first dielectric layer and the second contact layer. The first conductor layer is coupled between the first dielectric layer and the second dielectric layer. The third dielectric layer is coupled between the second dielectric layer and the second contact layer. The second conductor layer is coupled between the second dielectric layer and the third dielectric layer. Infrared radiation incident upon the first conductor layer is operable to create hot carriers that are injected from a conduction band of the first conductor layer to a conduction band of the second dielectric layer.

Other aspects of the disclosure will become apparent by consideration of the detailed description and accompanying drawings.

DETAILED DESCRIPTION

Figure 1:
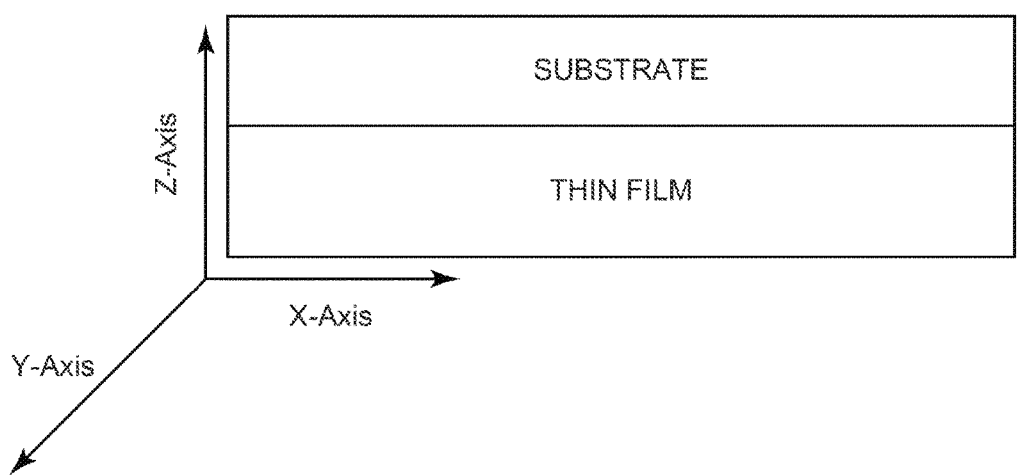
FIG. 1 is an example model to calculate optical modes supported by a conductor (i.e., thin film) and a dielectric interface, in accordance with some implementations.

Before any implementations of the disclosure are explained in detail, it is to be understood that the disclosure is not limited in its application to the details of the configuration and arrangement of components set forth in the following description or illustrated in the accompanying drawings. The disclosure is capable of other implementations and of being practiced or of being carried out in various ways. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. The term "dielectric" is used to refer to wide bandgap semiconductors with a bandgap greater than approximately three electron volts (eV).

In addition, it should be understood that implementations of the disclosure may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one implementations, the electronic based aspects of the disclosure may be implemented in software (for example, stored on non-transitory computer-readable medium) executable by one or more electronic processing units, such as a microprocessor and/or application specific integrated circuits ("ASICs"). As such, it should be noted that a plurality of hardware and software based devices, as well as a plurality of different structural components may be utilized to implement the disclosure. For example, "servers" and "computing devices" described in the specification can include one or more electronic processing units, one or more computer-readable medium modules, one or more input/output interfaces, and various connections (for example, a system bus) connecting the components.

The detection of infrared radiation is utilized in a wide variety of applications, such as thermography, night vision technologies, energy harvesting, surveillance, heat tracking, seeing through clouds and dust, telecommunications, etc.

The detection of infrared radiation is typically accomplished using narrow bandgap semiconductor compounds such as mercury cadmium telluride ("HgCdTe"). Such ternary compounds have compositionally tunable bandgaps that allow for the detection of infrared radiation in both the mid-wave infrared window ("MWIR") (i.e., from 3 micrometers to 5 micrometers) and the long-wave infrared window ("LWIR") (i.e., from 8 micrometers to 12 micrometers).

Alternative detection techniques can utilize, for example, the interactions between light and matter in infrared and near-infrared portions of the electromagnetic spectrum to detect infrared or near-infrared radiation at ambient room temperatures. These detection techniques make use of a phenomenon known as surface plasmon resonance. Surface plasmon resonance is the resonant oscillation of conductive band electrons in a material stimulated by light (for example, near-infrared radiation). The presence of oscillations or plasmon polaritons, such as, but not limited to surface plasmon polaritons from plasmon resonance enhances the interactions between light and matter, and enable "hot" carrier injection of carriers (for example, electrons) from one material to another.

Conductors with free carrier concentrations between approximately 1E19/cc and 5E20/cc support various optical modes to couple to infrared light. In other words, semiconductors doped to free carrier concentrations in such a way that the real part of the dielectric function becomes less than or equal to zero over the mid-to-long infrared energy range (for example, between approximately 3 microns and 12 microns) support optical mode to couple to infrared light. A surface plasmon polariton ("SPP") mode may be used to detect infrared light using conductive metal oxides (CMOs) as conductors.

For a planar interface between a dielectric and a conductor, all supported optical modes are found by solving the following equation (Equation 1) for the x, y, and z directions. For the model assumption of an infinite slab, the x and y directions are parallel to the interface and identical.

$$\begin{pmatrix} k^2 - \frac{\omega^2}{c^2}\varepsilon_{xx} & 0 & 0 \\ 0 & k^2 - \frac{\omega^2}{c^2}\varepsilon_{yy} & 0 \\ 0 & 0 & k^2 - \frac{\omega^2}{c^2}\varepsilon_{zz} \end{pmatrix} \times \begin{pmatrix} E_x \\ E_y \\ E_z \end{pmatrix} = 0 \qquad (1)$$

The dispersion relation for the SPP mode is found by solving Equation 1 for either the x or y direction. FIG. 1 illustrates an exemplary model for calculating the optical modes supported by a conductor (i.e., thin film) and a dielectric interface. The x-axis and the y-axis are identical. The z-axis is perpendicular to the interface (i.e., the x-axis and the y-axis) and is parallel to the thickness of the thin film.

This disclosure focuses on a mode propagating perpendicular to the interface in the z-axis direction. Solving Equation 1 for the z-axis direction yields a mode where $\varepsilon_z=0$. Unlike the SPP mode, this mode exists at an energy value where $\varepsilon_z=0$ for the dielectric constant of the conductor. Due to the requirement for $\varepsilon_z=0$ to support this optical mode, it is named the epsilon near zero ("ENZ") mode.

A single material supports both the SPP and ENZ modes. The key differences between these modes include, among other things: (1) the thicknesses that support the respective modes are above (for SPP) and below (for ENZ) the skin depth of the respective material; (2) the SPP mode exists over a range of energies while the ENZ mode exists only at a single energy; and (3) the spatial electric field confinement profile is different for ENZ and SPP modes around the interface.

Figure 2A:
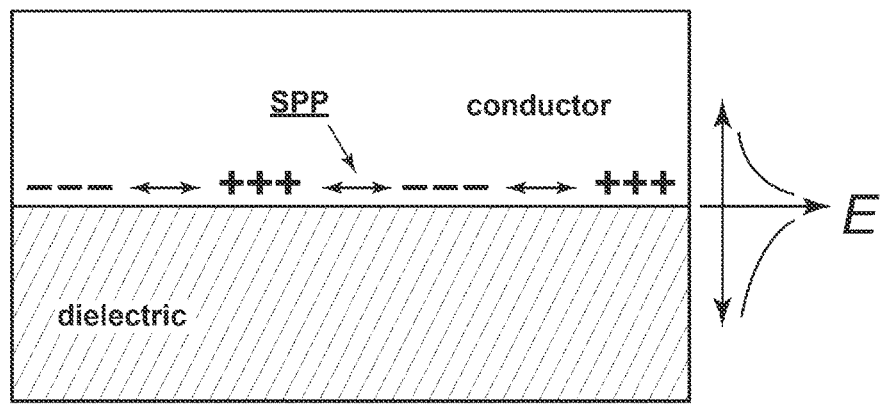
FIG. 2A is an example model of a surface plasmon polariton ("SPP") mode, in accordance with some implementations.
Figure 2B:
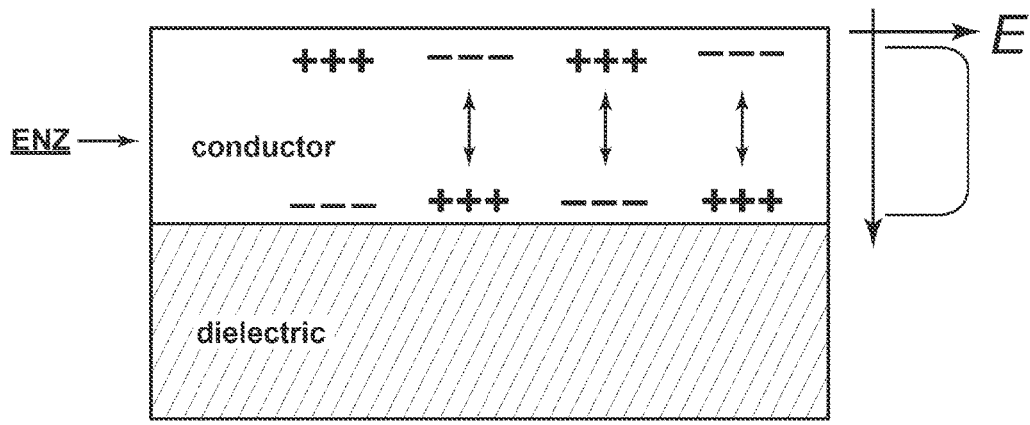
FIG. 2B is an example model of an epsilon near zero ("ENZ") mode, in accordance with some implementations.

The electric field confinement in the ENZ mode is substantially different from the electric field confinement that is achieved when coupling to a SPP mode. Some of these differences are illustrated in FIGS. 2A and 2B. As illustrated in FIG. 2A, the electric field confinement caused by coupling to an SPP mode extends into both the conductor and the dielectric, where the absolute electric field strength (E) decays exponentially away from the interface. The direction of the SPP electric field oscillation is parallel to the interface. The electric field confinement and the polarization direction of the SPP mode are along the conductor/dielectric interface.

As illustrated in FIG. 2B, the electric field confinement and the polarization direction of the ENZ mode are confined within the conductor slab. The strength of the field confinement is uniform across the thickness of the conductor. Furthermore, the direction of the oscillation is perpendicular to the interface. The electric field confinement and the polarization direction of the ENZ mode is confined within the conductor slab.

Similar to the SPP mode, the ENZ mode is tunable in energy by varying the carrier concentration of the conductor. The Drude model description of the dielectric function for a conductor may be summarized using the following equations:

$$\varepsilon = \varepsilon_\infty + (\omega_p^2 / ((\omega \times \gamma \times i) \times \omega^2)) \quad (2)$$

wherein,
  $\varepsilon$ = dielectric constant,
  $\varepsilon_\infty$ = high frequency dielectric constant, and
  $\gamma$ = damping.

$$\gamma = q/(\mu \times m_e) \quad (3)$$

wherein,
  $\mu$ = free carrier mobility.

Figure 3:
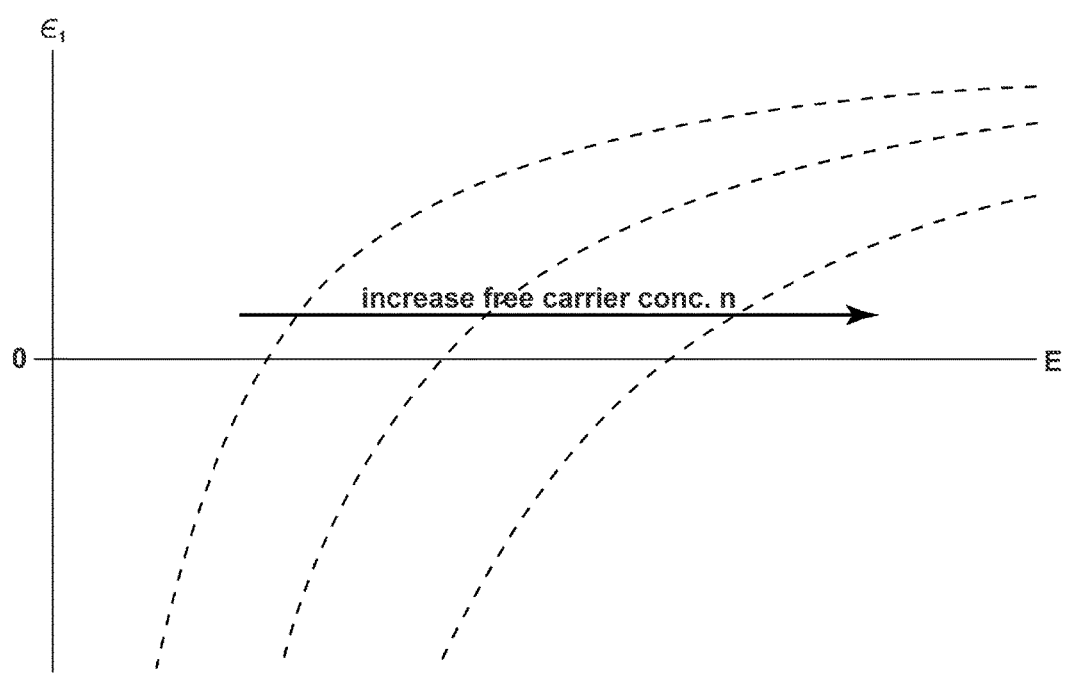
FIG. 3 is a graph illustrating example dielectric functions as a function of free carrier concentration, in accordance with some implementations.

The real part of the dielectric function crosses zero at a set energy that is tunable by changing the carrier concentration of the conductor. By increasing the free carrier concentration within a conductor (i.e., the ENZ energy), the energy where the real part of the dielectric function is crossing zero is tunable. Higher free carrier concentration results in an ENZ cross over at higher energies (i.e., shorter wavelength). Tuning of the dielectric function as a function of free carrier concentration is illustrated in FIG. 3. The tunability of the dielectric function implies that the resonance energy of the ENZ mode is also tunable by tuning the conductor layer's carrier concentration. The tunability and the electrical field confinement make this optical mode applicable for infrared radiation sensing and is a fundamental matter/light interaction for a PHIP detector.

Figure 4A:
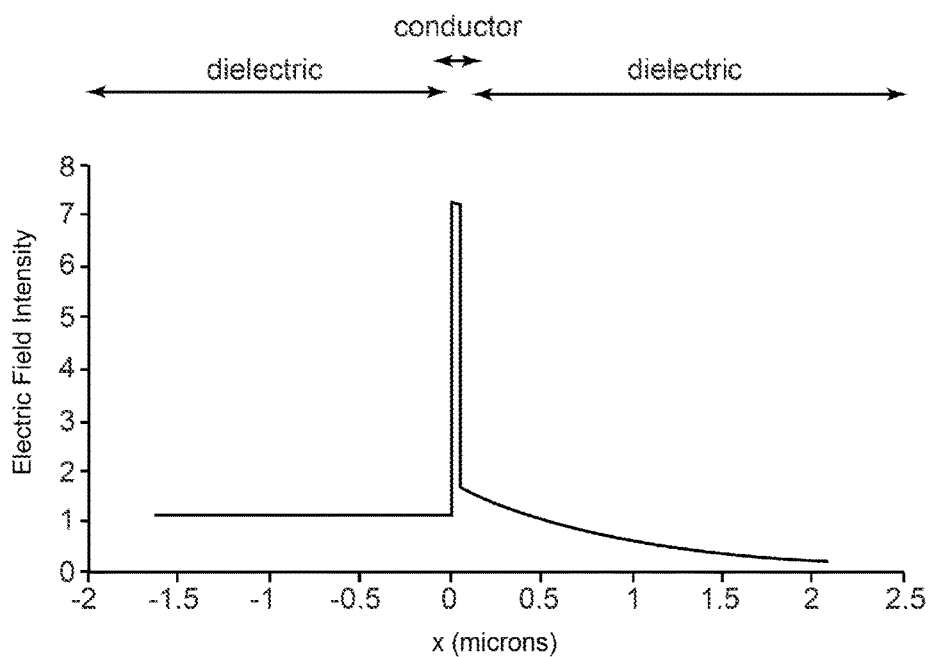
FIG. 4A is a graph illustrating an example electric field confinement of a 50 nanometer thick Drude conductor that couples light to the ENZ mode, in accordance with some implementations.
Figure 4B:
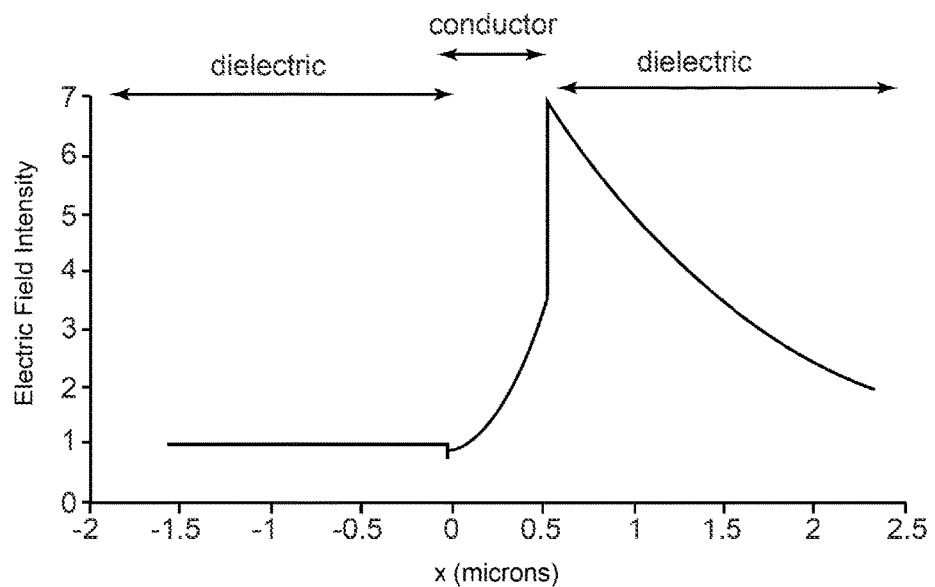
FIG. 4B is a graph illustrating an example electric field confinement in a 550 nanometer thick Drude conductor that couples light to the SPP mode, in accordance with some implementations.

The ENZ mode allows very strong electric field confinement within the conductor. To illustrate, an exemplary electric field confinement of the ENZ mode is compared to the confinement achieved by coupling to a SPP mode in the same conductor material. FIG. 4A illustrates an exemplary electrical field confinement across a dielectric/conductor interface in 2D of the ENZ mode. The electric field is entirely confined with the conductor slab. FIG. 4B illustrates an exemplary electrical field confinement across a dielectric/conductor interface in 2D of the SPP mode. The electric field is strongest at the interface, however, the electrical field decays into the conductor as well as the dielectric side of the interface exponentially. A broadband wavelength illumination between 2 and 12 micrometers is used in FIGS. 4A and 4B. Also, the conductors illustrated in FIGS. 4A and 4B include the following Drude parameters: a free carrier concentration of 9E19/cc, a mobility of 400, an effective electron mass of 0.21, and a high frequency dielectric constant of 5.

In FIGS. 4A and 4B, the x-axis is parallel to the interface normal of infinite slabs of material. In FIG. 4A, the electrical field confinement is caused by coupling to the ENZ mode of the conductor with a thickness of 50 nanometers (x-axis). The ENZ coupling includes a thickness of 50 nanometers because the film thickness needs to be below the skin depth of the conductor in order to support an ENZ mode. In FIG. 4B, the electrical field confinement is caused by coupling to the SPP mode of the conductor with a thickness of 550 nanometers. The SPP coupling includes a thickness of 550 nanometers because of the phase shift requirements of coupling to the SPP. As illustrated in FIGS. 4A and 4B, the ENZ mode confines the electric field entirely within the thin slab of material, whereas the SPP mode has the electrical field exponentially decaying away from the interface (into the conductor and the dielectric, thus into the ±directions).

The ENZ mode allows for extreme sub-wavelength confinement. For example, a 30 nanometer thick conductor film doped to 7E19/cc couples to 4.4 micrometer wavelength radiation and confines the electric field within the 30 nanometer thick conductor film. This corresponds to an interaction that effectively reduces the length scale of the incoming light by more than two orders of magnitude. This also results in a dramatic increase in the effective field intensity within the ENZ material upon supporting the optical mode. Coupling to the ENZ mode achieves high electric fields strengths which results in the creation of hot electrons.

Upon the decay of a polariton excitation (the ENZ mode is fundamentally a polariton) there are various decay paths that dissipate the excess energy. The polariton can thermalize (effectively heating up the structure) or it can re-emit a photon corresponding to the incident light energy. A third decay path is the creation of a hot electron (an electron in the conduction band of the conductor) which has excess energy added as kinetic energy. This kinetic energy allows the electron to be extracted and subsequently registered as current in a detector structure.

Figure 5:
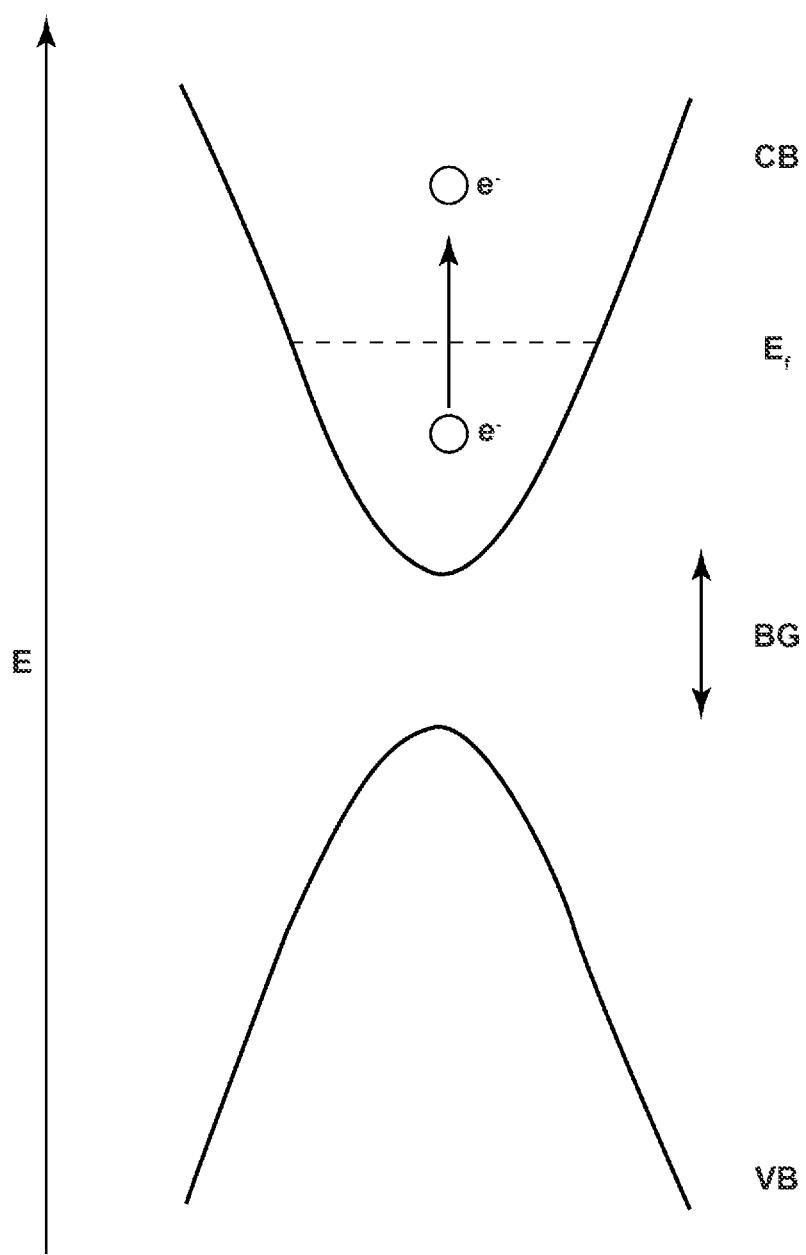
FIG. 5 is a diagram illustrating an example hot carrier generation in a degenerative doped semiconductor, in accordance with some implementations.

FIG. 5 illustrates an example of hot carrier generation in a degenerative doped semiconductor. The same principle applies for true metals, thus for materials without a bandgap. Upon polariton decay, the energy is added as kinetic energy to an electron in the conduction band. This electron is in excited state that typically is described as "hot." This excited state makes the electron distinguishable from the other free conduction electrons.

Figure 6:
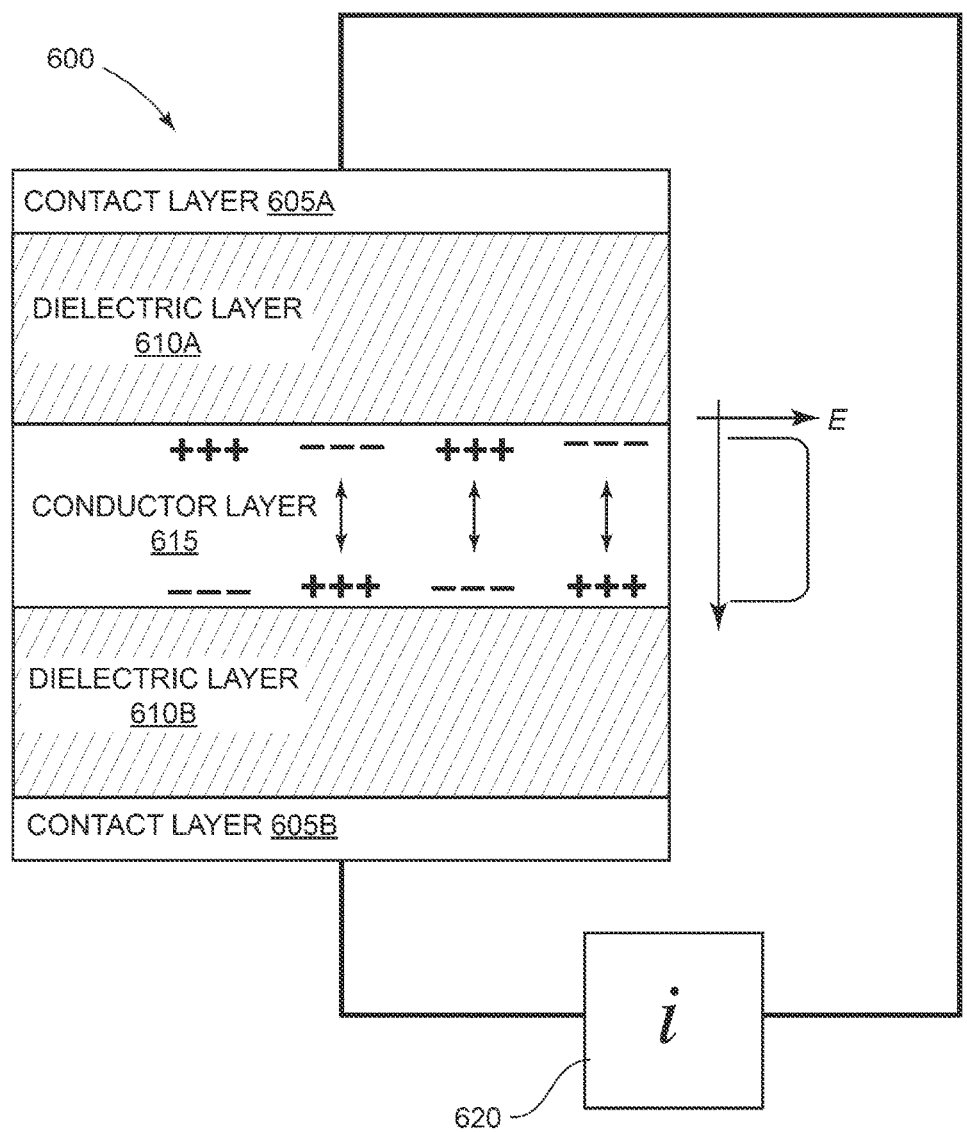
FIG. 6 is an example single element polaritonic hot electron photodetector ("PHIP") detector, in accordance with some implementations.

FIG. 6 includes an exemplary single element polaritonic hot electron photodetector ("PHIP") detector 600. The single element PHIP detector 600 illustrated in FIG. 6 includes two contact layers 605A and 605B, two dielectric layers 610A and 610B, a conductor layer 615 (i.e., the ENZ material), and a current/voltage meter 620. In some implementations, the thickness for the two dielectric layers 610A and 610B is between approximately 1 nanometer and 100 nanometers, and the thickness for the conductor layer 615 is between approximately 1 nanometer and 200 nanometers. The thickness of the conductor layer 615 is less than the skin depth of the conductor for the specific free carrier concentration used. The two contact layers 605A and 605B apply a voltage bias to the structure and collect a photocurrent.

In some implementations, the conductor layer 615 includes a conductive metal oxide/nitride (for example, cadmium oxide ("CdO"), ITO, AZO, GZO, $In_2O_3$, ScN, TiN, and SnO$_2$). In some implementations, the conductor layer 615 includes a dysprosium ("Dy") doped cadmium oxide ("CdO") (i.e., CdO:Dy). a conductive metal oxide/nitride (for example, cadmium oxide ("CdO"), ITO, AZO, GZO, In$_2$O$_3$, ScN, TiN, and SnO$_2$). In other implementations, the conductor layer 615 includes a (noble) metal (for example, Ag, Au, Al, W, and Ti). In other implementations, the conductor layer 615 includes a (wide bandgap) semiconductor (for example, GaN, ZnO, Si, SiC, GaAs, Ge, and InP). In some implementations, the two dielectric layers 610A and 610B include an oxide material (for example, Al$_2$O$_3$, magnesium oxide ("MgO"), CaO, Y$_2$O$_3$, and Dy$_2$O$_3$). In some implementations, the two contact layers 605A and 605B include a doped semiconductor (for example, Si, Ge, GaAs, gallium nitride ("GaN"), CdO, and ITO). In other implementations, the two contact layers 605A and 605B include a (noble) metal (for example, Ag, Au, Al, W, and Ti).

Figure 7:
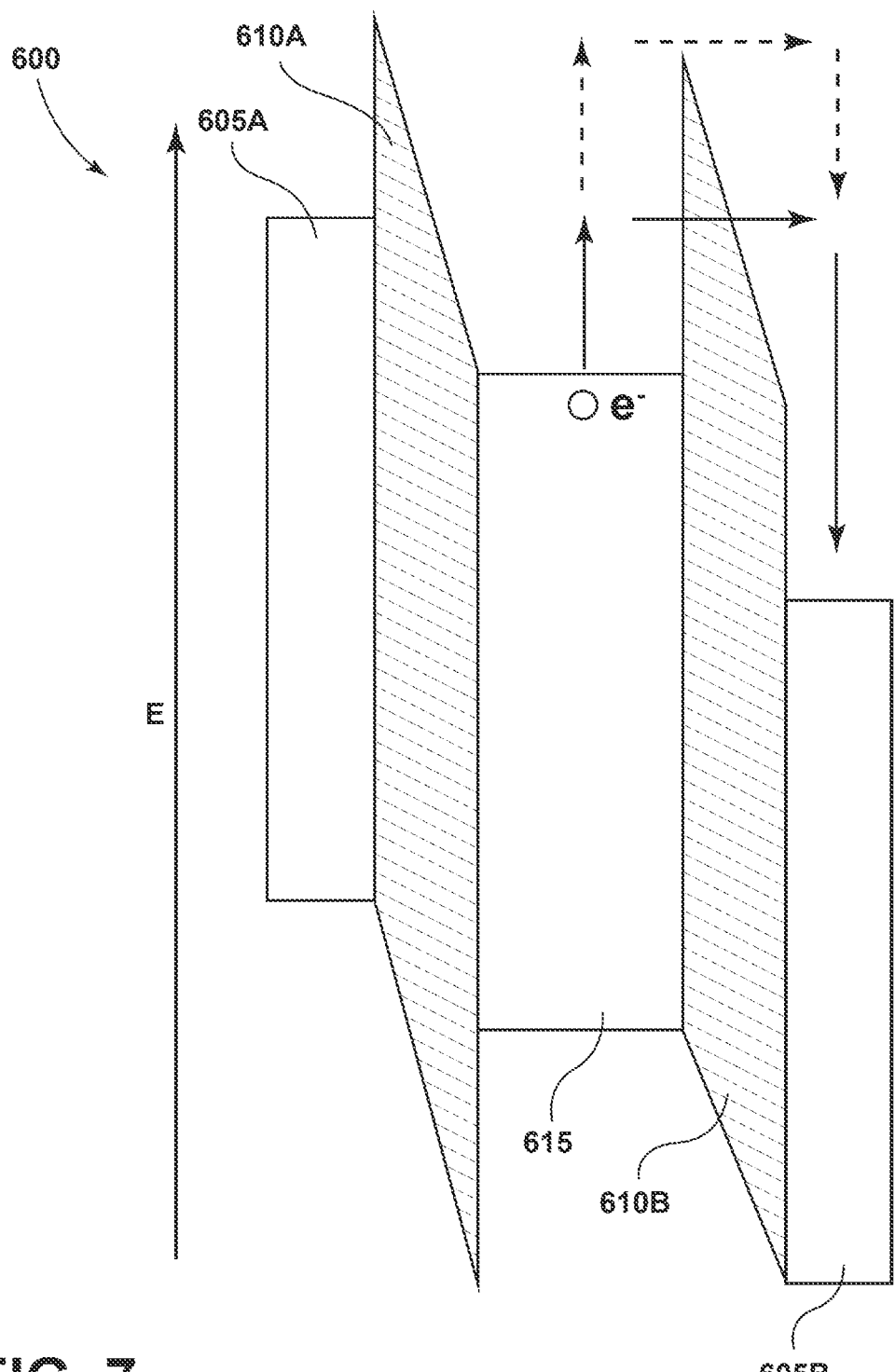
FIG. 7 is an example band structure of the single element PHIP detector in FIG. 6 under bias, in accordance with some implementations.

The PHIP structure allows hot electrons generated by ENZ mode decay to be extracted, and thus measured as a photocurrent by applying a voltage bias via the contact layers. By biasing the structure, the bandstructure within the element is modified. FIG. 7 depicts an exemplary schematic of a bandstructure in the single element PHIP detector 600 under voltage bias. The conductor layer 615 is surrounded by a dielectric barrier on both sides (i.e., the two dielectric layers 610A and 610B), creating a potential barrier. Under bias, the potential barrier is modified, allowing the generated hot electrons to be extracted. Two possible pathways for this extraction are illustrated in FIG. 7. In a first pathway (indicated by dashed arrows), the hot electron gains sufficient energy to get injected into the dielectric's conduction band. In a second pathway (indicated by solid arrows), the hot electron reaches sufficient energy to tunnel through the potential barrier, which has been reduced in size due to the voltage bias.

Under biased conditions, hot electrons created through the ENZ mode decay, are extracted through the dielectric layer and collected in the contact layer. The electron is thus detected as a photocurrent. The hot electrons traverse the potential barrier of the dielectric layer due to their higher kinetic energy. The hot electrons are transferred to the contact layer by means of either injection into the conduction band of the dielectric layer, or by tunneling through the potential barrier that was modulated and effectively reduced by the applied voltage bias. Both of these cases result in injection of an electron into the contact layer, where it is registered as a photocurrent.

Hot electrons generated by SPP decay follow similar physical phenomena as hot electrons generated by ENZ decay. However, due to the polarization direction of the electrical field in the SPP mode that ultimately decays to a hot electron, the directionality of the hot electrons generated by SPP decay is fundamentally different from ENZ decay. Hot electrons generated by SPP decay have their momentum primarily aligned in parallel with the conductor-dielectric interface. In applications requiring the hot electrons to be injected across the interface, this is an undesirable direction as the probability of injecting the hot electrons across the barrier, even if it carries enough energy, diminishes greatly. In contrast, ENZ mode decay hot electrons have their momentum aligned perpendicular to the conductor dielectric interface. This is an ideal alignment for injection across the interface barrier with the highest probability of injection. For conductors, the actual momentum distribution of hot electrons is influenced by the details and shape of the band structure of the conduction band.

Figure 8:
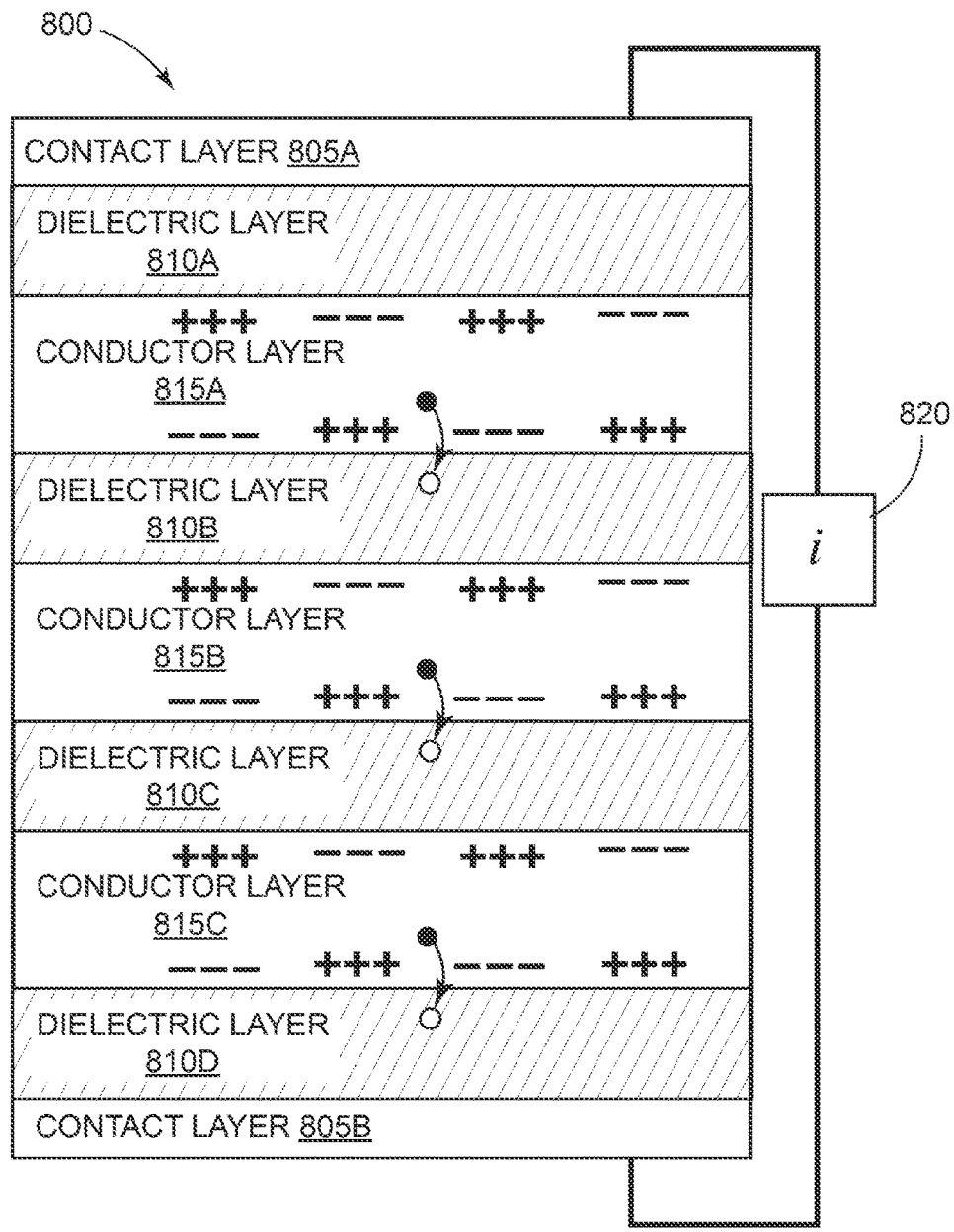
FIG. 8 is an example a multiple element PHIP detector, in accordance with some implementations.

A single element PHIP detector 600 was described above in relation to FIG. 6. Multiple PHIP elements can be stacked to expand PHIP functionality. FIG. 8 illustrates an example multiple element PHIP detector 800. In the example illustrated in FIG. 8, the multiple element PHIP detector 800 includes two contact layers 805A and 805B, four dielectric layers 810A, 810B, 810C, and 810D, three conductor layers 815A, 815B, and 815C, and a current/voltage meter 820. In the example illustrated in FIG. 8, three PHIP elements are combined, totaling the three conductor layers 815A, 815B, and 815C. Each of the three conductor layers 815A, 815B, and 815C can be designed individually.

In some implementations, each of the three conductor layers 815A, 815B, and 815C include the same optical properties. By choosing identical optical properties, the absorption of the ENZ mode of the entire stack is increased since each of these conduction layers couples to incoming light and the total absorption and hot carrier generation is the combined effect of each conductor layer. By adding enough identical ENZ layers, perfect absorption (substantially 100%) is achieved. At the same time, the multiple element PHIP detector 800 is biased via the two contact layers 805A and 805B, and hot electrons are extracted as a photocurrent.

Figure 9A:
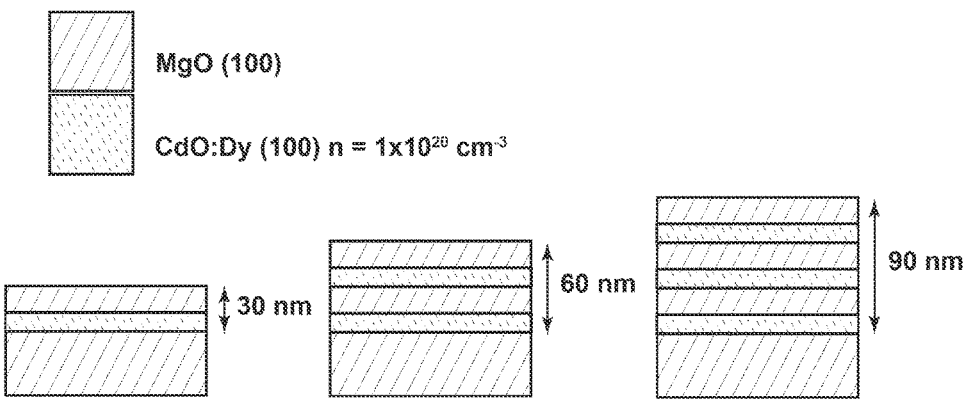
FIG. 9A is three example PHIP structures used in some implementations of PHIP detectors.
Figure 9B:
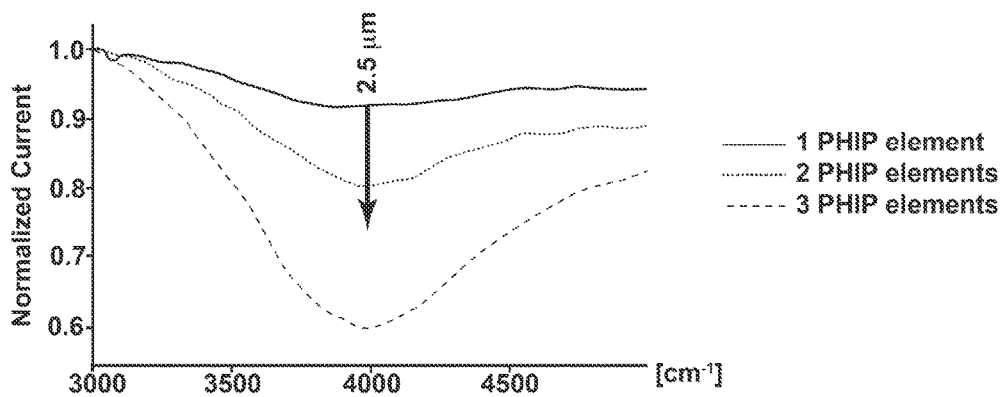
FIG. 9B is a graph illustrating an example absorption as a function of PHIP element count for the PHIP structures in FIG. 9A.

FIG. 9A illustrates three exemplary PHIP structures with one, two, and three identical conductor layers. The conductor layers in the three PHIP structures illustrated in FIG. 9A are formed of doped CdO. The dielectric constant of each of the conductor layers in the three PHIP structures illustrated in FIG. 9A is approximately zero at a working wavelength of approximately 2.5 microns. The substrate and dielectric layers in the three PHIP structures illustrated in FIG. 9A are formed of magnesium oxide ("MgO"). The contact layers are omitted from the three PHIP structures illustrated in FIG. 9A for illustrative purposes. FIG. 9B illustrates the absorption (optical response) of the three PHIP structures illustrated in FIG. 9A. FIG. 9B illustrates how the ENZ mode absorption stacks once the number of absorbing ENZ layers (i.e., the conductor layers) is increased. The absorption around 2.5 micron wavelength increases with the amount of PHIP elements used, demonstrating how a single absorption band is intensified by stacking identically doped ENZ materials.

Figure 10A:
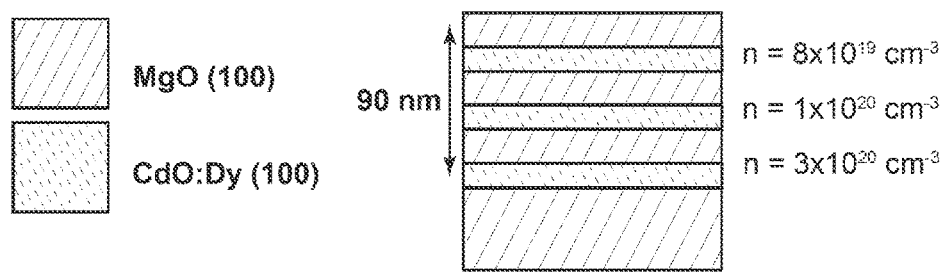
FIG. 10A is an example PHIP structure having multiple ENZ modes, in accordance with some implementations.
Figure 10B:
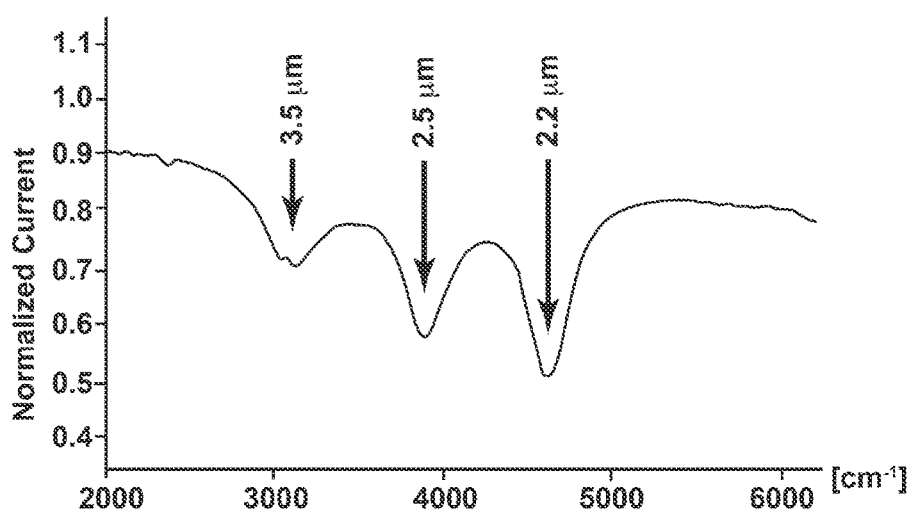
FIG. 10B is a graph illustrating an example absorption of the PHIP structure in FIG. 10A.

In alternate implementations, the multiple ENZ modes (conductor layers) are tuned to different energies. This effectively broadens the detector response around a center absorption energy as well as makes the detector sensitive to a plurality of individual bands. FIG. 10A illustrates an exemplary PHIP structure including three conducive layers tuned to different energies. The conductive layers in the PHIP structure illustrated in FIG. 10A are formed of doped CdO. In FIG. 10A, the conductive layers are doped to support three distinct ENZ modes. A dielectric constant of the top conductor layer in the PHIP structure illustrated in FIG. 10A is approximately zero at a working wavelength of approximately 3.5 microns. A dielectric constant of the middle conductor layer in the PHIP structure illustrated in FIG. 10A is approximately zero at a working wavelength of approximately 2.5 microns. A dielectric constant of the bottom conductor layer in the PHIP structure illustrated in FIG. 10A is approximately zero at a working wavelength of approximately 2.2 microns. The substrate and dielectric layers in the PHIP structure illustrated in FIG. 10A are formed of MgO. The contact layers are omitted from the three PHIP structures illustrated in FIG. 10A for illustrative purposes. By individually doping each ENZ layer, the PHIP structure illustrated in FIG. 10A creates three independent absorption bands within a 90 nanometer thick structure, as illustrated in FIG. 10B. Each individual element supports one ENZ mode, which is found as an individual absorption band of the structure.

By combining multiple PHIP elements, it is thus possible to tailor the absorption spectrum of the PHIP structure. In some implementations, individual absorption bands are created and the PHIP response is intentionally broadened over an energy range of interest, such as the 3 micron to 5 micron atmospheric window. In some implementations, the PHIP structure includes 10 ENZ layers (i.e., 10 conductor layers).

Figure 11:
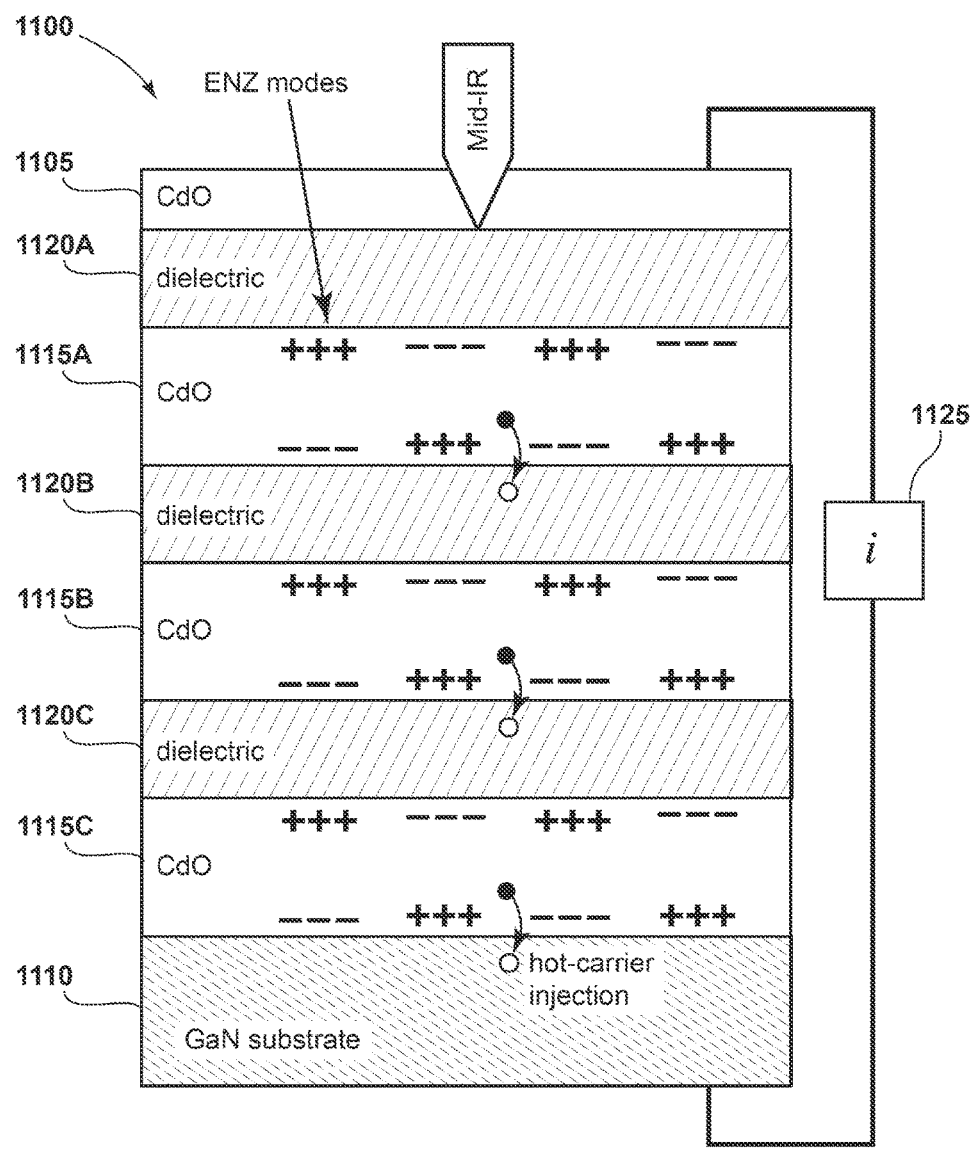
FIG. 11 is an example multiple element PHIP detector, in accordance with some implementations.

FIG. 11 includes an exemplary example multiple element PHIP detector 1100. The multiple element PHIP detector 1100 illustrated in FIG. 11 includes a contact layer 1105, a substrate layer 1110, three conductor layers 1115A, 1115B, and 1115C, three dielectric layers 1120A, 1120B, and 1120C, and a current/voltage meter 1125. The contact layer 1105 (for example, a first contact layer) is formed of a doped cadmium oxide ("CdO"). The substrate layer 1110 (for example, a second contact layer) is formed of lightly doped gallium nitride ("GaN") (for example, 1E17/cc). The three conductor layers 1115A, 1115B, and 1115C are formed of doped CdO with an ENZ mode tuned to a working wavelength of approximately 4.4 microns. The three dielectric layers 1120A, 1120B, and 1120C are formed of magnesium oxide ("MgO").

Figure 12:
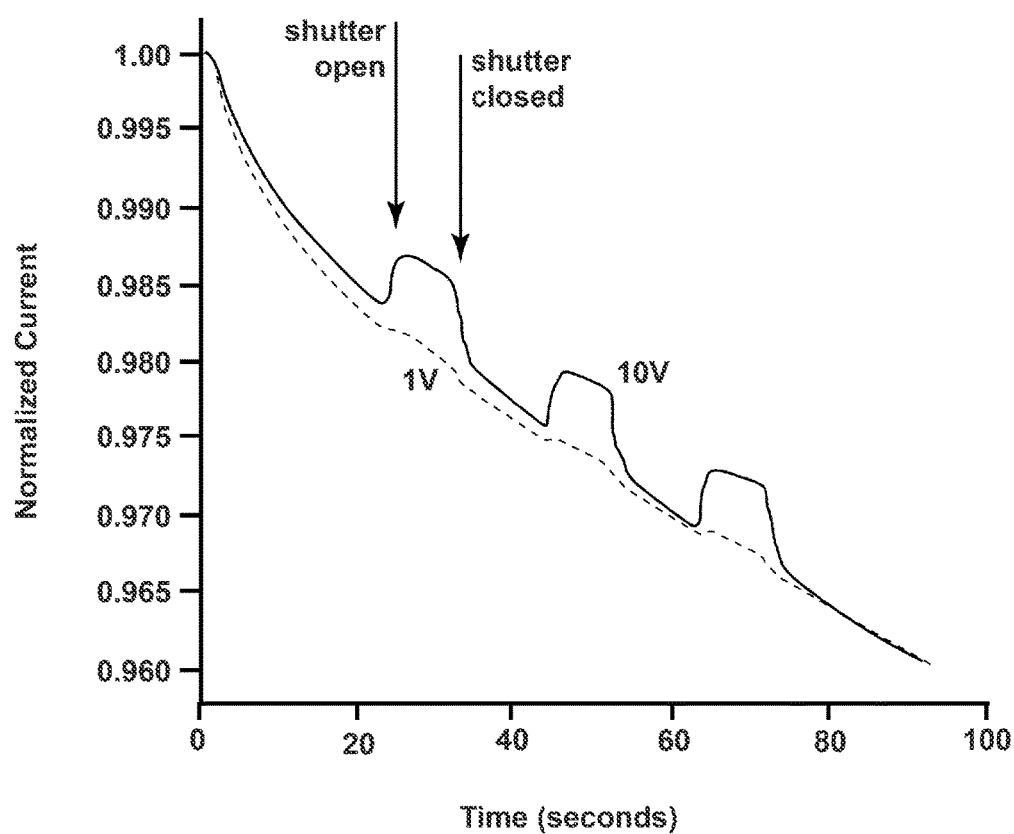
FIG. 12 is a graph illustrating example photocurrent measurements for the multiple element PHIP detector in FIG. 11.

FIG. 12 illustrates example photocurrents of the multiple element PHIP detector 1100 for different bias voltages when a quantum cascade laser ("QCL") emits shuttered infrared radiation with a 4.4 micron wavelength on the multiple element PHIP detector 1100. In FIG. 12, bias voltages of 1 Volt and 10 Volts are applied to the multiple element PHIP detector 1100.

Thus, the disclosure provides, among other things, a polaritonic hot electron infrared photodetector that detect infrared radiation in the ENZ mode. Various features and advantages of the disclosure are set forth in the following claims.

What is claimed is:

1. A detector for detecting infrared radiation, the detector comprising:
   a first contact layer;
   a second contact layer;
   a first dielectric layer coupled between the first contact layer and the second contact layer;
   a second dielectric layer coupled between the first dielectric layer and the second contact layer; and
   a conductor layer coupled between the first dielectric layer and the second dielectric layer,
   wherein infrared radiation incident upon the conductor layer is operable to create hot carriers that are injected from a conduction band of the conductor layer to a conduction band of the second contact layer,
   wherein the conductor layer is formed of a conducting metal oxide.

2. The detector of claim 1, wherein a dielectric constant of the conductor layer is approximately zero at a working wavelength of the detector.

3. The detector of claim 1, wherein the detector is configured to operate in an epsilon near zero mode.

4. The detector of claim 1, wherein the first contact layer and the second contact layer apply a voltage bias between the first dielectric layer and the second dielectric layer.

5. The detector of claim 1, wherein the conducting metal oxide is cadmium oxide.

6. The detector of claim 5, wherein the cadmium oxide is doped with dysprosium.

7. The detector of claim 5, wherein the first dielectric layer and the second dielectric layer are formed of magnesium oxide.

8. The detector of claim 7, wherein the first contact layer is formed of the cadmium oxide doped with dysprosium.

9. The detector of claim 8, wherein the second contact layer is formed of gallium nitride.

10. A detector for detecting infrared radiation, the detector comprising:
    a first contact layer;
    a second contact layer;
    a first dielectric layer coupled between the first contact layer and the second contact layer;
    a second dielectric layer coupled between the first dielectric layer and the second contact layer;
    a first conductor layer coupled between the first dielectric layer and the second dielectric layer;
    a third dielectric layer coupled between the second dielectric layer and the second contact layer; and
    a second conductor layer coupled between the second dielectric layer and the third dielectric layer,
    wherein infrared radiation incident upon the first conductor layer is operable to create hot carriers that are injected from a conduction band of the first conductor layer to a conduction band of the second dielectric layer,
    wherein a first carrier concentration of the first conductor layer is different than a second carrier concentration of the second conductor layer.

11. The detector of claim 10, wherein a first carrier concentration of the first conductor layer is substantially equal to a second carrier concentration of the second conductor layer.

12. The detector of claim 10, wherein a first dielectric constant of the first conductor layer is approximately zero at a working wavelength of the detector, and wherein a second dielectric constant of the second conductor layer is approximately zero at the working wavelength of the detector.

13. The detector of claim 10, wherein a first dielectric constant of the first conductor layer is approximately zero at a first working wavelength of the detector, wherein a second dielectric constant of the second conductor layer is approximately zero at a second working wavelength of the detector, wherein the second working wavelength of the detector is different than the first working wavelength of the detector.

14. The detector of claim 10, wherein the detector is configured to operate in an epsilon near zero mode.

15. A detector for detecting infrared radiation, the detector comprising:
    a first contact layer;
    a second contact layer;
    a first dielectric layer coupled between the first contact layer and the second contact layer;
    a second dielectric layer coupled between the first dielectric layer and the second contact layer;
    a first conductor layer coupled between the first dielectric layer and the second dielectric layer;
    a third dielectric layer coupled between the second dielectric layer and the second contact layer; and
    a second conductor layer coupled between the second dielectric layer and the third dielectric layer,
    wherein infrared radiation incident upon the first conductor layer is operable to create hot carriers that are injected from a conduction band of the first conductor layer to a conduction band of the second dielectric layer, wherein the first conductor layer and the second conductor layer are formed of a conducting metal oxide.

16. The detector of claim 15, wherein the conducting metal oxide is cadmium oxide doped with dysprosium.

17. The detector of claim 15, wherein the conducting metal oxide is cadmium oxide, and wherein the first dielectric layer, the second dielectric layer, and the third dielectric layer are formed of magnesium oxide.

18. The detector of claim 17, wherein the first contact layer is formed of the cadmium oxide doped with dysprosium, and wherein the second contact layer is formed of gallium nitride.

* * * * *